United States Patent [19]

Saunders

[11] 4,173,745

[45] Nov. 6, 1979

[54] FILTERING CONFIGURATION USING FEED-THROUGH CAPACITOR

[75] Inventor: Roger A. Saunders, Cedar Rapids, Iowa

[73] Assignee: Rockwell International Corporation, El Segundo, Calif.

[21] Appl. No.: 856,827

[22] Filed: Dec. 2, 1977

[51] Int. Cl.² ............ H03H 7/04; H01G 4/42; H01G 4/38; H05K 1/04
[52] U.S. Cl. .................. 333/182; 174/68.5; 333/185; 361/302
[58] Field of Search ............ 333/70 R, 70 S, 73 C, 333/76, 79, 12, 84 R, 24 C, 182, 184, 185, 24 R; 361/397, 302, 399–406, 409, 303; 357/80; 174/68.5; 339/17 R, 17 B, 17 T, 17 C, 17 N, 17 M

[56] References Cited

U.S. PATENT DOCUMENTS 3,530,411  9/1970  Sear ........................... 361/401

Primary Examiner—Alfred E. Smith
Assistant Examiner—Marvin Nussbaum
Attorney, Agent, or Firm—Terry M. Blackwood; H. Fredrick Hamann; L. Lee Humphries

[57] ABSTRACT

A printed circuit board, preferably, including a feed-through capacitor having outer and inner conductors separated by a dielectric through which the outer and inner conductors capacitively couple. An electrical energy carrying printed circuit line which is to be filtered is connected to the capacitor outer conductor. The inner conductor is connected to a local ground potential.

7 Claims, 4 Drawing Figures

FILTERING CONFIGURATION USING FEED-THROUGH CAPACITOR

This invention relates generally to capacitors, more specifically to feed-through capacitive filters for printed circuit boards, and in its preferred application to EMI filtering.

For controlling conducted EMI the prior art commonly employs a feed-through capacitor in a mode wherein the capacitor center conductor is connected to the line to be filtered and the dielectric material surrounding the center conductor provides a capacitive path (low impedance RF path) to the grounding metal chassis in which the feed-through capacitor is mounted. Such technique presents an assembly problem of transition from connector to filter, and then filter to printed circuit board, because several hand wiring connections are usually required.

In accordance with the present invention, low cost printed wiring technology is employed to eliminate several hand wiring operations and also the signal line disruptions encountered in implementing conventional feed-through filtering. These and other advantages, objects, and features, of the invention will become more apparent upon reference to the following specification and appended drawings in which:

FIG. 2a is a perspective view defining location of

Figure 2A:
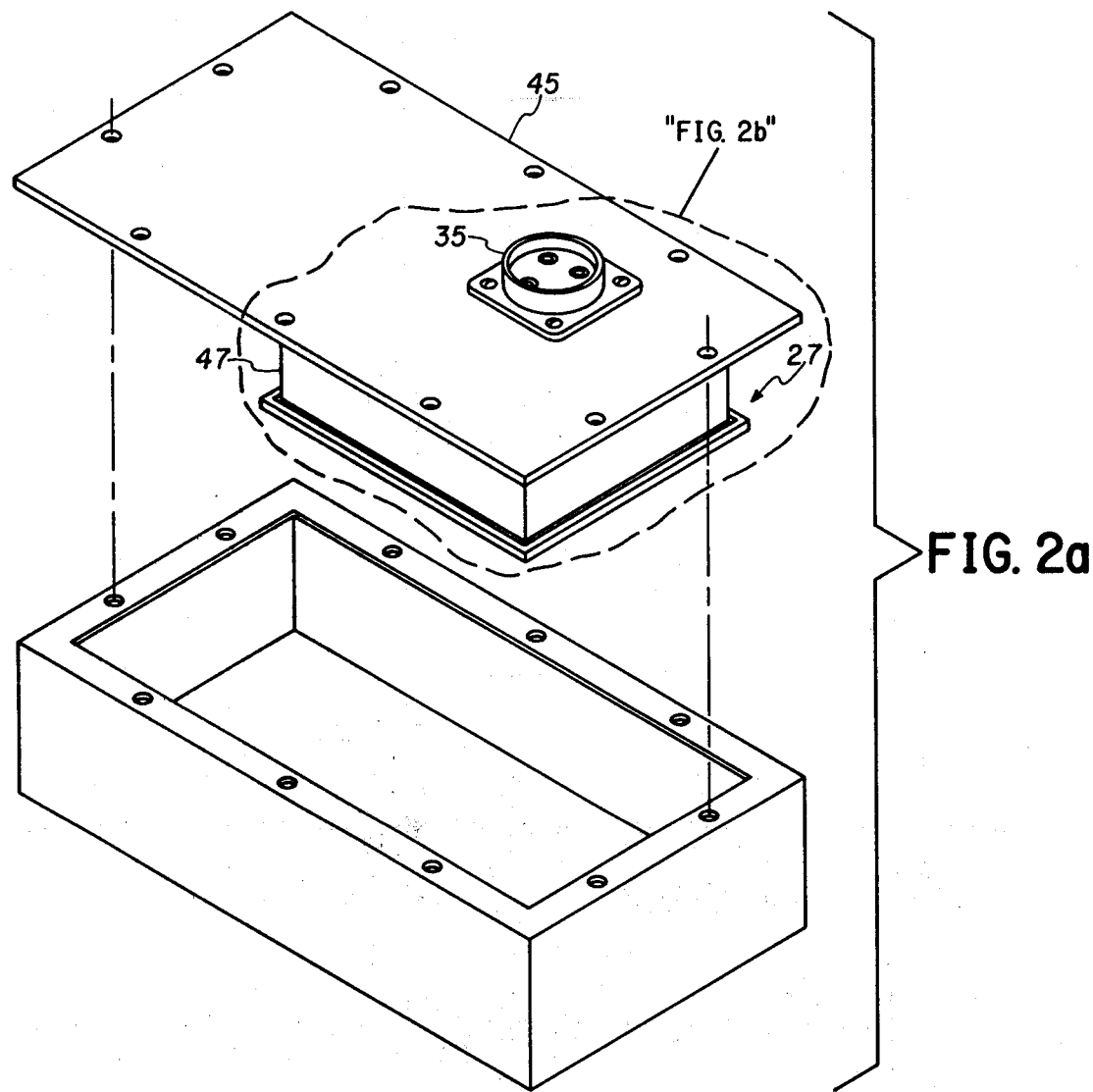
Figure 3:
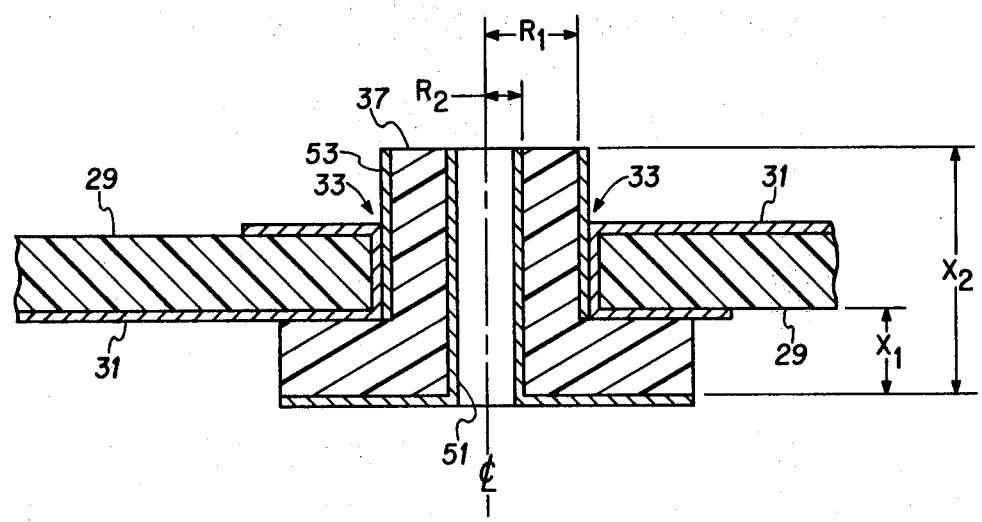
Figure 2B:
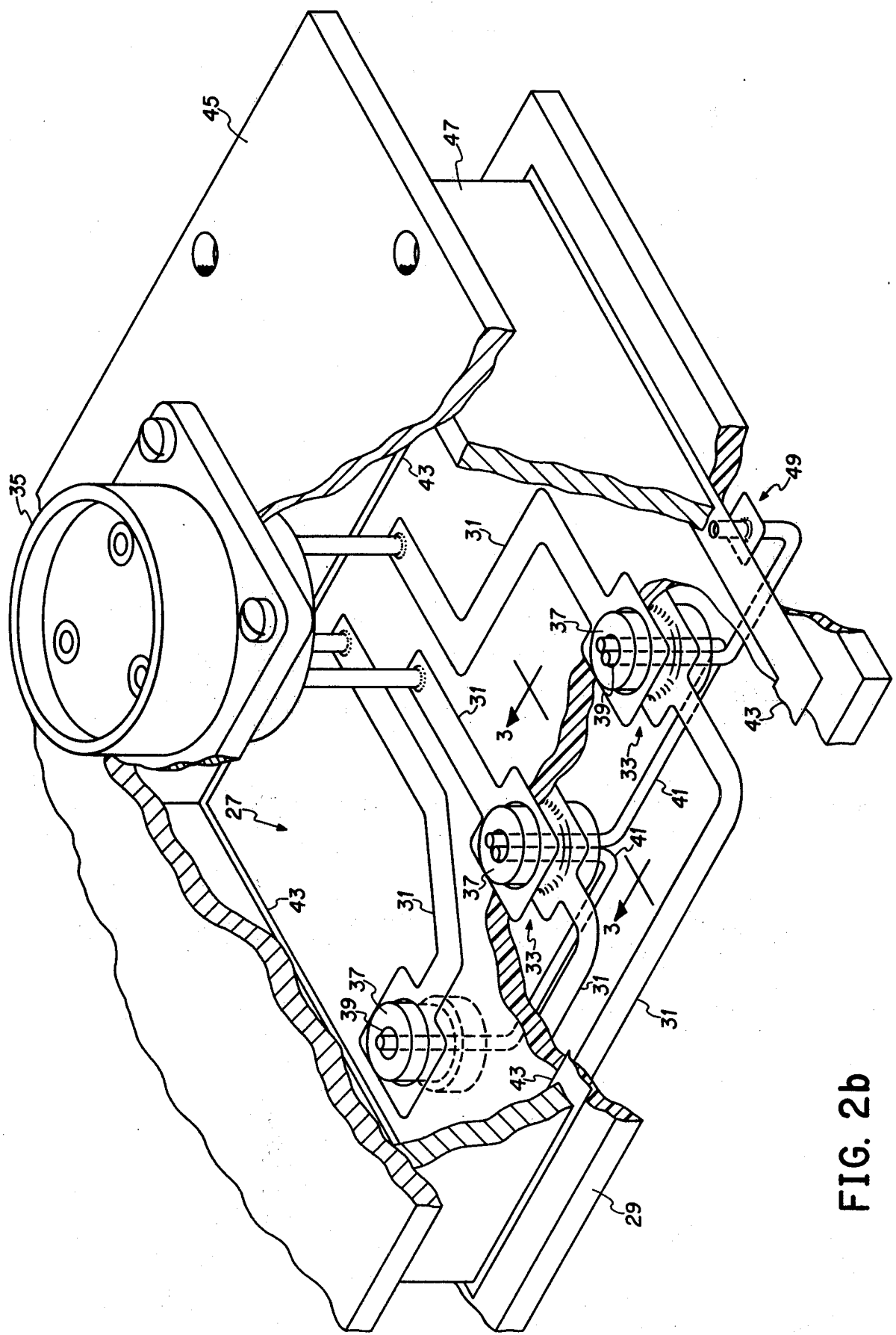

FIG. 2b which is a partially cutaway perspective view illustrating a simplified form of the presently preferred inventive embodiment; and FIG. 3 is a sectional view from aspect 3—3 in FIG. 2b showing a part thereof in more detail.

Figure 1:
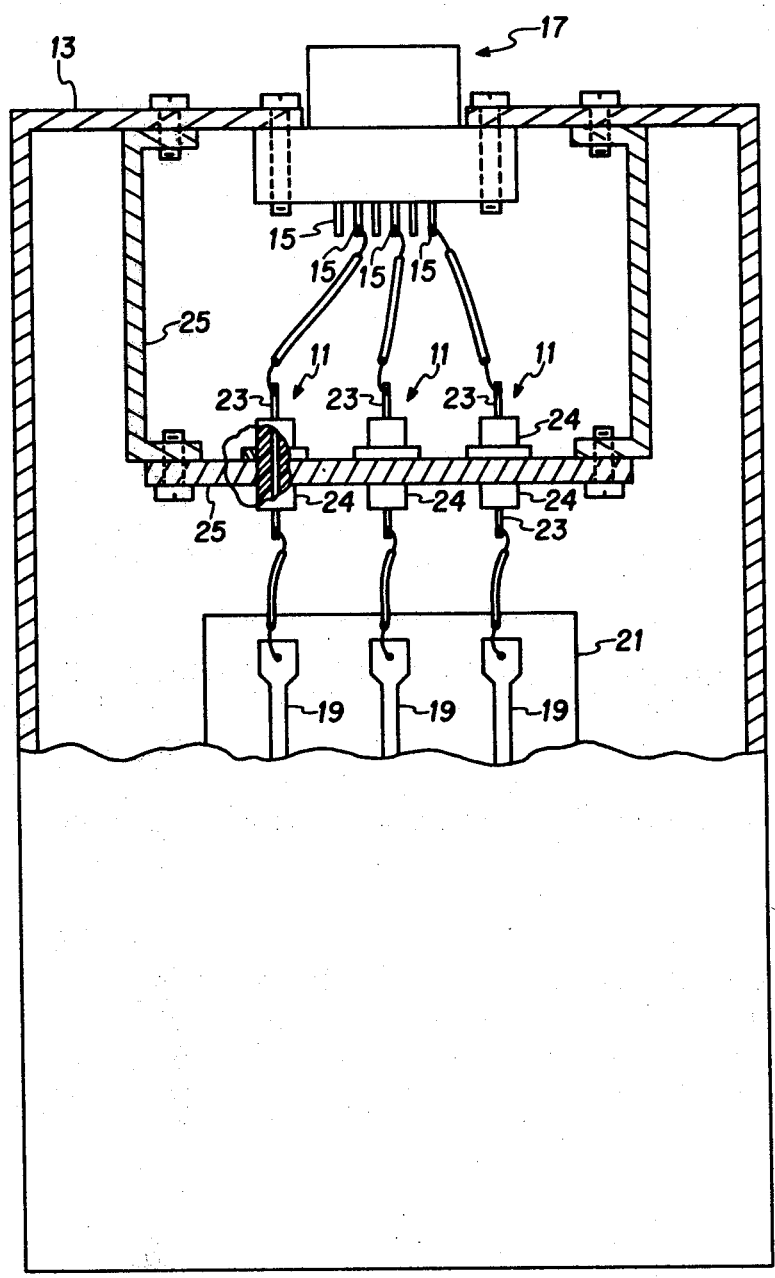
FIG. 1 is a partially cutaway view of a typical prior art EMI filtering configuration.

FIG. 1 illustrates the above-mentioned prior art technique of controlling conducted EMI using conventional feed-through capacitors 11. In FIG. 1, signals, power leads, etc., coming into equipment housing 13 via a cable (not shown) are routed from pins 15 of connector 17 first to feed-through capacitors 11 and then to printed wires 19 of printed circuit board 21, each connection from pins 15 to capacitors 11 and then on to printed wires 19 being a hand-wired connection. Each of center conductors 23 is capacitively coupled through its surrounding dielectric 24 to metal chassis 25 which in turn is mechanically and electrically connected to the local ground, i.e., to housing 13. Although only a few leads are shown for convenience of illustration, the number of hand wiring connections and the problems and inconvenience caused thereby should be apparent.

As above prefaced, and as is exemplified in FIGS. 2a and 2b, a unique printed circuit board configuration permits elimination of several manual connecting operations yet provides EMI filtering. Referring to FIG. 2b, a printed circuit board 27 comprising a dielectric substrate 29 and printed leads or wires 31, contains a plated-through hole 33 for each of the employed pins of connector 35. FIG. 2b shows the dielectric substrate 29 cut away around two of the illustrated through holes so as to illustrate the conductive and substantially cylindrically formed plating which provides dc shorting between printed leads on the upper and lower sides of the dielectric substrate. Conforming to and within each plated-through hole in the printed circuit board is a dielectric insert 37, each insert itself having a plated or otherwise metalized through hole 39 which constitutes an internal electrically conductive path or lead. Conductive leads or "fences" 41 worked into the insert holes from the underside of the printed circuit board provide electrical interconnection and an electrical common along all the insert center leads. Each pin of connector 35 is preferably connected directly to an appropriate one of printed wires 31, each of which electrically connects to a small plated-through hole suitable for receiving one of the connector leads. Printed lead or strip 43 is a continuous ground bus surrounding the printed board EMI filtering area and electrically connects to metal chassis or case 45 via bus-conforming conductive wall 47. The common potential of the insert center leads is preferably local ground potential (i.e., chassis or case reference potential) and same is effectuated by connecting the common into bus 43 from the lower side via one or more plated-through holes such as 49 which are dc shorted to bus 43. Printed leads 31 on the underside of the printed circuit board go to circuit components (not shown) such as resistors, inductors, transistors, etc., which are mounted on the printed circuit board underside and generally outside the bus 43 perimeter.

Electrically, each printed circuit board plated-through hole acts in concert with its paired centrally conductive dielectric insert to form a capacitor whose low RF impedance shunts to ground the EMI on the upper printed leads 31 thereby constituting a bypass filter by preventing the EMI from passing on to underside leads 31 and components to which the underside leads in turn are subsequently connected.

It is thus seen that conducting the line to be filtered along a feed-through capacitor outer conductor permits EMI filtering configurations compatible with printed circuit wiring. It should also be apparent, especially since the typical embodiment often involves approximately 30 lines as opposed to only three as illustrated in the simplified FIG. 2b, that a great deal of manual assembly effort and time is conserved with the FIG. 2b type of apparatus. The through holes receiving the connector leads may be patterned to match the connector pin arrangement thereby permitting a simple plug-in operation followed by wave-soldering. The inserts 37 can be auto-inserted and wave-soldered (since the inserts are preferably metalized on the outside also) to the plated-through holes. Fences 41, after insertion into inserts 37, can also be wave-soldered to ensure electrical continuity.

Turning now to FIG. 3 which shows one of the FIG. 2b feed-through capacitors in more detail, insert 37 presently comprises a ceramic dielectric tubular member flanged at one end, the insert interior and exterior, 51 and 53 respectively, being metalized to provide electrically conductive paths insulated from one another by the tubular dielectric material. Soldering is used to secure insert 37 within the plated-through hole 33 in dielectric substrate 29. Relative to other FIG. 3 features, the thickness of the metalic coatings (i.e., the printed circuit board leads, the plated-through hole, and the insert coatings) is somewhat exaggerated for clarity of illustration, and realistically said metallic coatings are, typically, only about 0.003 inches thick. Typical values, in inches, for other FIG. 3 defined dimensions are as follows: $R_1 = 0.062$, $R_2 = 0.032$, $X_1 = 0.065$, $X_2 = 0.165$. Typical capacitance achieved is about 800 picofarads and of course can be increased or decreased by varying $(R_1 - R_2)$.

Other variations presently contemplated include shorting all insert center leads together with, instead of fences 41, a metalic plate from which pins protrude in a pattern to match and be received by the insert interiors. Also, inductance may be easily incorporated into the printed lines 31 to provide LC filters. Moreover, the above concepts could be adapted to multilayer construction.

Thus, while particular embodiments of the present invention have been shown and or described, it is apparent that changes and modifications may be made therein without departing from the invention in its broader aspects. The aim of the appended claims, therefore, is to cover all such changes and modifications as fall within the true spirit and scope of the invention.

What is claimed is:

1. The combination comprising:
   (a) a printed circuit board comprising a dielectric substrate having a plurality of printed wiring leads on a first side of the substrate and a plurality of printed wiring leads on a second side of the substrate, said substrate also having a plurality of holes completely therethrough from said first side to said second side, each of the said plurality of holes having therein a subcombination comprising (i) a dielectric member being received in said hole, (ii) a first electrically conductive means located between said dielectric substrate and said dielectric member for providing a dc short from a printed wiring lead on said first substrate side to a printed wiring lead on said second substrate side, and (iii) a second electrically conductive means inside said dielectric member so as to be insulated from said first electrically conductive means by said dielectric member and so as to capacitively couple with said first electrically conductive means through said dielectric member, and
   (b) dc shorting means for electrically interconnecting all said second electrically conductive means.

2. The combination as defined in claim 1 wherein said dc shorting means is electrically connected to a local ground potential.

3. The combination as defined in claim 1 wherein each printed wiring lead on said first side is connected to a different one of a plurality of connector pins.

4. The combination comprising:
   a printed circuit board comprising a dielectric substrate having a first printed wiring lead on one side and a second printed wiring lead on the other side, said substrate having a plated-through hole electrically connecting said first and second printed wiring leads, and
   a dielectric member substantially conforming to and being received by said plated-through hole, said dielectric member bearing substantially centrally thereof an electrically conductive means insulated from said conductive plated-through hole so as to capacitively coupled therewith through said dielectric member.

5. The combination as defined in claim 4 wherein said dielectric member center conductor is connected to a local ground potential.

6. The combination comprising:
   a printed circuit board comprising a dielectric substrate having a first printed wiring lead on one side and a second printed wiring lead on the other side, said substrate also having a hole completely therethrough from one side of said substrate to the other side of said substrate,
   a dielectric member for being received in said hole,
   a first electrically conductive means located between said dielectric substrate and said dielectric member for providing a dc short from said first printed wiring lead to said second printed wiring lead, and
   a second electrically conductive means insulated from said first electrically conductive means by said dielectric member so as to capacitively couple with said first electrically conductive means through said dielectric member.

7. The combination as defined in claim 6 wherein said second electrically conductive means is connected to a local ground potential.

* * * * *